(12) United States Patent
Chen et al.

(10) Patent No.: US 11,637,218 B2
(45) Date of Patent: Apr. 25, 2023

(54) LIGHT-EMITTING DIODE

(71) Applicant: XIAMEN SAN'AN OPTOELECTRONICS CO., LTD., Xiamen (CN)

(72) Inventors: Gong Chen, Xiamen (CN); Su-Hui Lin, Xiamen (CN); Sheng-Hsien Hsu, Xiamen (CN); Minyou He, Xiamen (CN); Kang-Wei Peng, Xiamen (CN); Ling-Yuan Hong, Xiamen (CN)

(73) Assignee: Xiamen San'an Optoelectronics Co., Ltd., Fujian (CN)

( * ) Notice: Subject to any disclaimer, the term of this patent is extended or adjusted under 35 U.S.C. 154(b) by 304 days.

(21) Appl. No.: 17/130,550

(22) Filed: Dec. 22, 2020

(65) Prior Publication Data
US 2021/0193868 A1    Jun. 24, 2021

(30) Foreign Application Priority Data
Dec. 23, 2019  (CN) .......................... 201922330841.X

(51) Int. Cl.
*H01L 33/14*    (2010.01)
*H01L 33/42*    (2010.01)

(52) U.S. Cl.
CPC ............ *H01L 33/145* (2013.01); *H01L 33/42* (2013.01)

(58) Field of Classification Search
CPC ............................ H01L 33/145; H01L 33/42
See application file for complete search history.

(56) References Cited

U.S. PATENT DOCUMENTS

| | | | |
|---|---|---|---|
| 6,417,525 B1* | 7/2002 | Hata | H01L 33/32 |
| | | | 257/749 |
| 2017/0069789 A1* | 3/2017 | Kim | H01L 33/145 |
| 2017/0098741 A1* | 4/2017 | Lee | H01L 33/38 |
| 2017/0194531 A1* | 7/2017 | Huang | H01L 33/24 |
| 2017/0263816 A1* | 9/2017 | Yang | H01L 33/44 |
| 2019/0148592 A1* | 5/2019 | Takeuchi | H01L 33/145 |
| | | | 257/103 |
| 2021/0057607 A1* | 2/2021 | Lin | H01L 33/44 |

* cited by examiner

*Primary Examiner* — Mark W Tornow
(74) *Attorney, Agent, or Firm* — Rosenberg, Klein & Lee

(57) ABSTRACT

A light-emitting diode includes a semiconductor light-emitting stack, a transparent conductive layer, a first current blocking layer, and a first electrode pad. The transparent conductive layer is disposed on the semiconductor light-emitting stack, and is formed with a first opening defined by an inner edge thereof. The first current blocking layer is formed on the semiconductor light-emitting stack, and is surrounded by and spaced apart from the inner edge of the transparent conductive layer by a first gap. The first electrode pad fully covers the first current blocking layer so as to permit the first electrode pad to be in contact with the semiconductor light-emitting stack through the first gap.

20 Claims, 9 Drawing Sheets

LIGHT-EMITTING DIODE

CROSS-REFERENCE TO RELATED APPLICATION

This application claims priority of Chinese Utility Model Patent Application No. 201922330841.X, filed on Dec. 23, 2019.

FIELD

The disclosure relates to a semiconductor device, and more particularly to a light-emitting diode.

BACKGROUND

Light-emitting diode (LED) chips have advantages of long service life and low power consumption. As LED technology matures, LED chips are widely applied in various fields. An existing LED chip generally includes a substrate, a first conductivity type semiconductor layer, an active layer, a second conductivity type semiconductor layer, a first electrode formed on the first conductivity type semiconductor layer, a second electrode formed on the second conductivity type semiconductor layer, and a transparent conductive layer covering on the first conductivity type semiconductor layer. The first electrode of a conventional face-up LED chip generally includes a first electrode pad and a first electrode extension. At least an edge of a lower surface of the first electrode pad is in contact with the transparent conductive layer, and a current blocking layer is provided beneath the transparent conductive layer that is located beneath the lower surface of the first electrode pad. Typically, the current blocking layer extends beyond a covering area of the lower surface of the first electrode pad, which is in contact with the transparent conductive layer so as to block a vertical current transfer between the edge of the lower surface of the first electrode pad and the first conductivity type semiconductor layer.

However, the conventional lateral LED chip may have some shortcomings. For example, the first electrode pad has a low adhesion to both the transparent conductive layer and the current blocking layer, and thus, in a subsequent wiring process, might have poor wiring reliability or might be detached upon application of an external force. In addition, in the case that the current blocking layer extends beyond the covering area of the first electrode pad, when forming an opening on a protective layer covering on the first electrode pad, an etchant might have an easy access to the current blocking layer through an outer periphery of the first electrode pad and the transparent conductive layer, which might cause the current blocking layer to be etched by the etchant, thereby lowering the reliability of the conventional lateral LED chip.

SUMMARY

Therefore, an object of the disclosure is to provide a light-emitting diode that can alleviate at least one of the drawbacks of the prior art mentioned above.

According to the disclosure, the light-emitting diode includes a semiconductor light-emitting stack, a transparent conductive layer, a first current blocking layer, and a first electrode pad.

The semiconductor light-emitting stack includes, in sequence from bottom to top, a second conductivity type semiconductor layer, a light-emitting layer, and a first conductivity type semiconductor layer.

The transparent conductive layer is disposed on the first conductivity type semiconductor layer, and is formed with a first opening which is defined by an inner edge of the transparent conductive layer.

The first current blocking layer is formed on the first conductivity type semiconductor layer, and is surrounded by and spaced apart from the inner edge of the transparent conductive layer by a first gap which has a predetermined width.

The first electrode pad is formed on the first current blocking layer to fully cover an upper surface and an outer peripheral surface of the first current blocking layer so as to permit the first electrode pad to be in contact with the first conductivity type semiconductor layer through the first gap.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
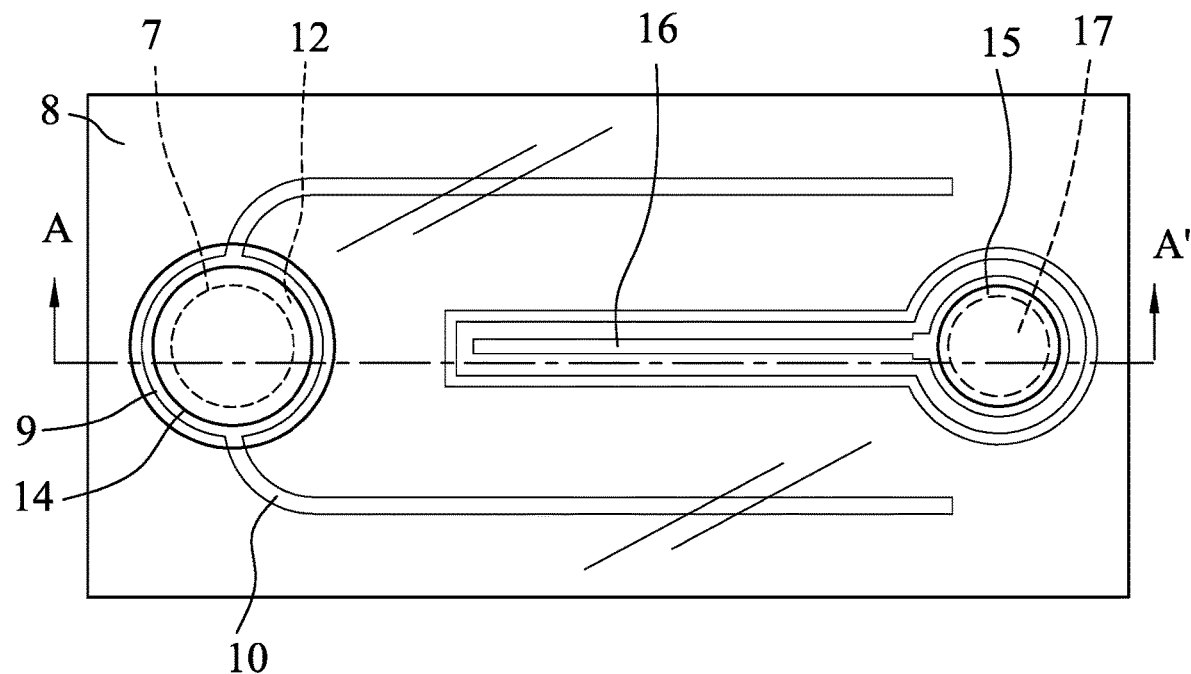
FIG. 1 is a schematic top view illustrating a first embodiment of a light-emitting diode according to the disclosure.

Before the disclosure is described in greater detail, it should be noted that where considered appropriate, reference numerals have been repeated among the figures to indicate corresponding or analogous elements, which may optionally have similar characteristics.

It should be noted that, directional terms, such as "vertical," "horizontal," "top," "bottom," "upper," "lower," "inner," "inwardly," "outer," and "outwardly," "front," "rear," "left," "right", "top" and "bottom," may be used to assist in describing the disclosure based on the orientation of the embodiments shown in the figures. The use of these directional definitions should not be interpreted to limit the disclosure in any way.

Figure 2:
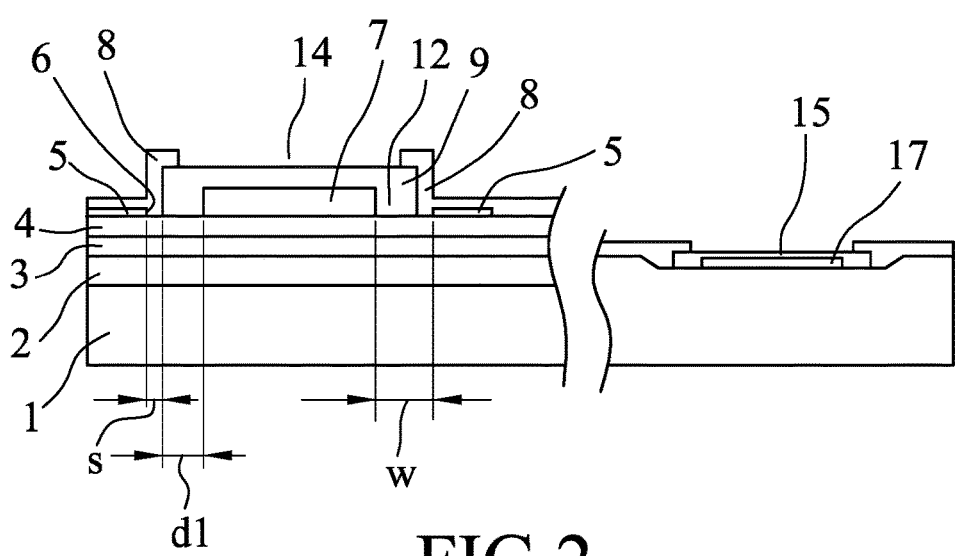
FIG. 2 is a cross-sectional view taken along a line A-A' of FIG. 1.
Figure 3:
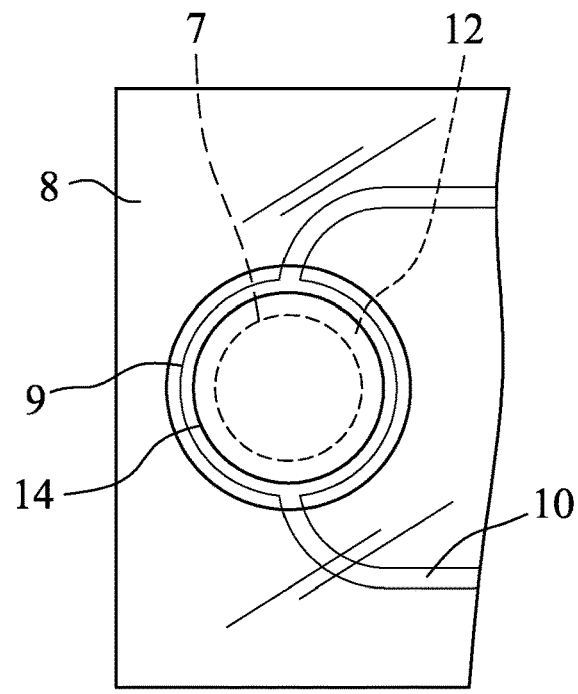
FIG. 3 is a fragmentary view of FIG. 1.

Referring to FIGS. 1 to 3, a light-emitting diode (LED) according to a first embodiment of the disclosure is shown to include a substrate 1, a semiconductor light-emitting stack, a transparent conductive layer 5, a first current blocking layer 7, and a first electrode pad 9. It should be noted that the drawings, which are for illustrative purposes only, are not drawn to scale, and are not intended to represent the actual sizes or actual relative sizes of the components of the LED. In an embodiment, the LED may be a lateral LED.

The substrate 1 may be one of a patterned sapphire substrate, a sapphire substrate, a GaN substrate, an AlN substrate, a SiC substrate, and a Si substrate. In certain embodiments, the substrate 1 may be a patterned sapphire substrate.

The semiconductor light-emitting stack includes, in sequence from bottom to top, a second conductivity type semiconductor layer 2, a light-emitting layer 3, and a first conductivity type semiconductor layer 4.

Specifically, each of the first conductivity type semiconductor layer 4 and the second conductivity type semiconductor layer 2 may be one of a cladding layer and a confining layer. In certain embodiments, the first conductivity type semiconductor layer 4 and the second conductivity type semiconductor layer 2 may have different conductivity types, electrical properties, polarities, or doping elements that are used to provide electrons or holes. In this embodiment, the first conductivity type semiconductor layer 4 is a P-type semiconductor layer made of Mg-doped GaN, and the second conductivity type semiconductor layer 2 is an N-type semiconductor layer made of Si-doped GaN. It should be noted that, although the first conductivity type semiconductor layer 4 is a P-type semiconductor layer and the second conductivity type semiconductor layer 2 is an N-type semiconductor layer in this embodiment, the first conductivity type semiconductor layer 4 may be an N-type semiconductor layer and the second conductivity type semiconductor layer 2 may be a P-type semiconductor layer in other embodiments.

The light-emitting layer 3 may be one of a single heterostructure, a double heterostructure, a double-sided heterostructure, and a multi-layered quantum well structure. In this embodiment, the light-emitting layer 3 is a multi-layered quantum well structure. Examples of a material for making the light-emitting layer 3 may include, but are not limited to, I-type semiconductor material, P-type semiconductor material, and N-type semiconductor material.

The transparent conductive layer 5 is disposed on the first conductivity type semiconductor layer 4, and is formed with a first opening 6 which is defined by an inner edge of the transparent conductive layer 5. The transparent conductive layer 5 may be made of a transparent conductive material, and may be a thin layer of metal (e.g., Au, or Ni) or metal oxide (e.g., $ZnO_2$, $In_2O_3$, or $SnO_2$). In certain embodiments, the transparent conductive layer 5 may be made of indium tin oxide (ITO). The first opening 6 may be formed centrally in the transparent conductive layer 5, so as to expose the first conductivity type semiconductor layer 4.

Figure 4:
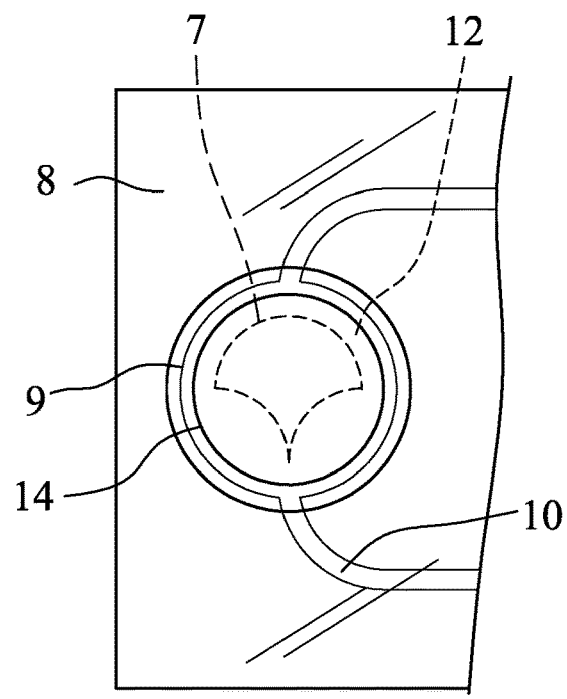
FIGS. 4 to 6 are views similar to FIG. 3, but illustrating variations of the first embodiment.
Figure 5:
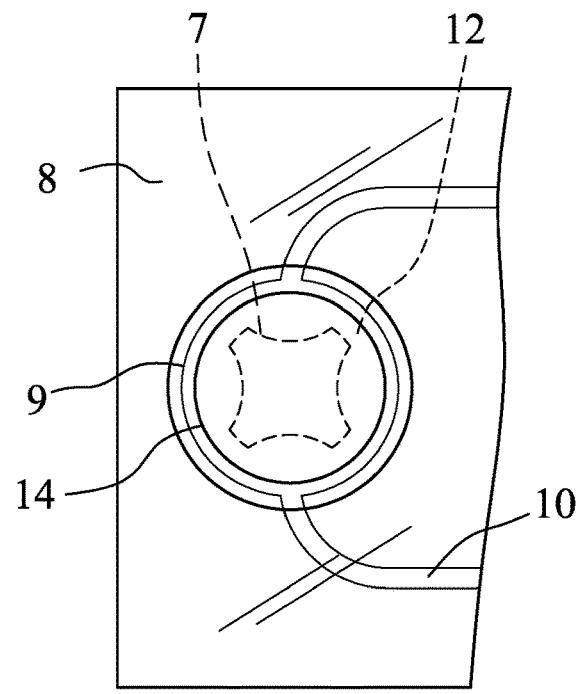
Figure 6:
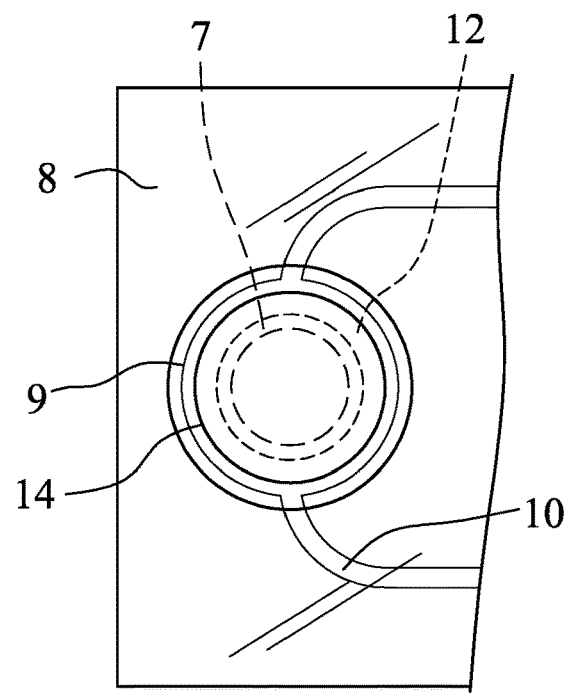

The first current blocking layer 7 is formed on the first conductivity type semiconductor layer 4, and is surrounded by and spaced apart from the inner edge of the transparent conductive layer 5 by a first gap 12 which has a predetermined width (W). There are no particular limitations on the configuration of the first current blocking layer 7. The first current blocking layer 7 may include at least one block. In certain embodiments, the block may be in a ring shape. In other embodiments, the block may be in a solid shape selected from the group consisting of a circle shape, a drop shape, a polygonal shape, a crescent shape, a fan shape, and an arc shape. In this embodiment, as shown in FIG. 3, the first current blocking layer 7 includes a block in a circle shape. In an embodiment shown in FIG. 4, the block included in the first current blocking layer 7 is in a drop shape. In an embodiment shown in FIG. 5, the block included in the first current blocking layer 7 is in a polygonal shape. In an embodiment shown in FIG. 6, the block included in the first current blocking layer 7 is in a ring shape. In certain embodiments, the first current blocking layer 7 may have a diameter smaller than that of the first opening 6.

In an embodiment, the predetermined width (W) of the first gap 12 may range from 0.1 μm to 40 μm. In an embodiment, the predetermined width (W) of the first gap 12 may range from 1 μm to 5 μm.

The first electrode pad 9 is formed on the first current blocking layer 7 to fully cover an upper surface and an outer peripheral surface of the first current blocking layer 7 so as to permit the first electrode pad 9 to be in contact with the first conductivity type semiconductor layer 4 through the first gap 12.

In an embodiment, the first electrode pad 9 may have a diameter not greater than that of the first opening 6. In an embodiment, the first electrode pad 9 may have a diameter greater than that of the first current blocking layer 7. In such case, the first electrode pad 9 may have a radial thickness (dl) on an outer peripheral surface of the first current blocking layer 7, and the radial thickness (dl) may range from 0.1 μm to 20 μm, such as range from 1 μm to 5 μm. In an embodiment, the first electrode pad 9 may have a height greater than that of the first current blocking layer 7. In an embodiment, the outer peripheral surface of the first electrode pad 9 and the inner edge of the transparent conductive layer 5 may be separated by a spacing (s) ranging from 5 μm to 20 μm. Because the first electrode pad 9 fully covers the upper surface and the outer peripheral surface of the first current blocking layer 7 and is in direct contact with the first conductivity type semiconductor layer 4, the adhesion of the first electrode pad 9 to the first conductivity type semiconductor layer 4 may be enhanced. In addition, the first electrode pad 9 is typically made of a metallic material. In other words, the first electrode pad 9 has a good ductility. Therefore, in a subsequent wiring process, the first electrode pad 9 may be useful for dampening the wiring force and reducing the shear force applied on the first current blocking layer 7 to thereby prevent the first current blocking layer 7 from being damaged, which may avoid undesirable detachment of the first electrode pad 9.

In an embodiment shown in FIGS. 1 and 2, the LED may further include a protective layer 8 which covers the transparent conductive layer 5, the first gap 12, the semiconductor light-emitting stack, and at least a portion of the first electrode pad 9. As shown in FIG. 2, the protective layer 8 may also cover a portion of the second conductivity type semiconductor layer 2, an inclined lateral surface of the light-emitting layer 3, and an inclined lateral surface of the first conductivity type semiconductor layer 4. The protective layer 8 is formed with a second opening 14 on a surface of the first electrode pad 9 opposite to the first current blocking layer 7 such that a portion of the surface of the first electrode pad 9 is exposed through the second opening 14. In certain embodiments, the second opening 14 may be centrally formed on the surface of the first electrode pad 9 opposite to the first current blocking layer 7. In other embodiments, the second opening 14 may have a diameter not greater than that of the first electrode pad 9. The protective layer 8 can be used to protect the first electrode pad 9, a second electrode pad 15, the first conductivity type semiconductor layer 4, and the second conductivity type semiconductor layer 2 from being adversely affected by moisture, so as to reduce the risk of electrical leakage and aging. The protective layer 8 may be made of a dielectric insulating material (e.g., silicon dioxide, or silicon nitride), and may be light-transmissive.

When the protective layer 8 is subjected to an etching process to form the second opening 14, an etchant can be effectively prevented from diffusing into the first current blocking layer 7 because the first current blocking layer 7 is covered by the first electrode pad 9. Thus, the first current blocking layer 7 may be prevented from being etched by the etchant. The second opening 14 is provided to permit access of an external bonding wire to the first electrode pad 9. In addition, as shown in FIG. 2, because the protective layer 8 is filled in the first gap 12 between the first electrode pad 9 and the transparent conductive layer 5, the first electrode pad 9 is prevented from coming into contact with the transparent conductive layer 5 in both the horizontal and vertical directions. As such, in the subsequent wiring process, a poor wiring reliability due to a relative low adhesion between the transparent conductive layer 5 and the first electrode pad 9 may be eliminated, and a reliability of the LED may be improved.

In an embodiment shown in FIG. 1, the LED may further include a first electrode extension 10 which is connected to an edge of the first electrode pad 9. The first electrode extension 10 extends from the edge of the first electrode pad 9 to be disposed on and in contact with the transparent conductive layer 5. In certain embodiments, the LED may further include a plurality of the first electrode extensions 10 that are uniformly distributed. In an embodiment shown in FIG. 1, the LED includes two first electrode extensions 10. Since the first electrode pad 9 is not in ohmic contact with the transparent conductive layer 5, the degree of current spread around the first electrode pad 9 in both the horizontal and vertical directions may be reduced. In this case, the current spreading efficiency between the first electrode pad 9 and the transparent conductive layer 5 can be increased, so that the current can be promoted to spread towards other areas beyond the first electrode pad 9, thereby increasing the brightness of the LED.

In an embodiment shown in FIGS. 1 and 2, the LED may further include a recess, the second electrode pad 15, at least one third current blocking layer 17, and at least one second electrode extension 16.

The recess is obliquely extended from the first conductivity type semiconductor layer 4 to a surface or an interior of the second conductivity type semiconductor layer 2, so as to expose the surface or interior thereof.

The second electrode pad 15 is disposed on a portion of the second conductivity type semiconductor layer 2 that is exposed by the recess.

The at least one third current blocking layer 17 is disposed beneath the second electrode pad 15, and is mainly provided to prevent the current from being concentrated beneath the second electrode pad 15 and to enhance reflection of a light emitted from the light-emitting layer 3.

The at least one second electrode extension 16 is connected to an edge of the second electrode pad 15, and is extended to the inclined lateral surface of the first conductivity type semiconductor layer 4. In certain embodiments, the LED may further include a plurality of the second electrode extensions 16 that are uniformly distributed.

The structure of the at least one third current blocking layer 17 may be the same as that of the first current blocking layer 7. Each of the first current blocking layer 7 and the at least one third current blocking layer 17 may be made of a light-transmissive insulating material independently selected from the group consisting of silicon dioxide, silicon nitride, silicon oxynitride, titanium oxide, and aluminium oxide. Each of the first current blocking layer 7 and the at least one third current blocking layer 17 may be independently formed as one of a single layer structure, a multi-layered structure, and an alternately stacked structure that includes multiple layers made of alternating materials (e.g., a distributed bragg reflector). In certain embodiments, each of the first current blocking layer 7 and the at least one third current blocking layer 17 may be a $SiO_2$ layer. In certain embodiments, each of the first current blocking layer 7 and the at least one third current blocking layer 17 may have a thickness ranging from 1200 Å to 4500 Å.

In certain embodiments, each of the first electrode pad 9, the second electrode pad 15, the first electrode extension 10, and the second electrode extension 16 may be made of a material independently selected from the group consisting of Au, Ag, Cu, Al, Cr, Ni, Ti, Pt, alloys thereof, and laminates thereof.

Figure 7:
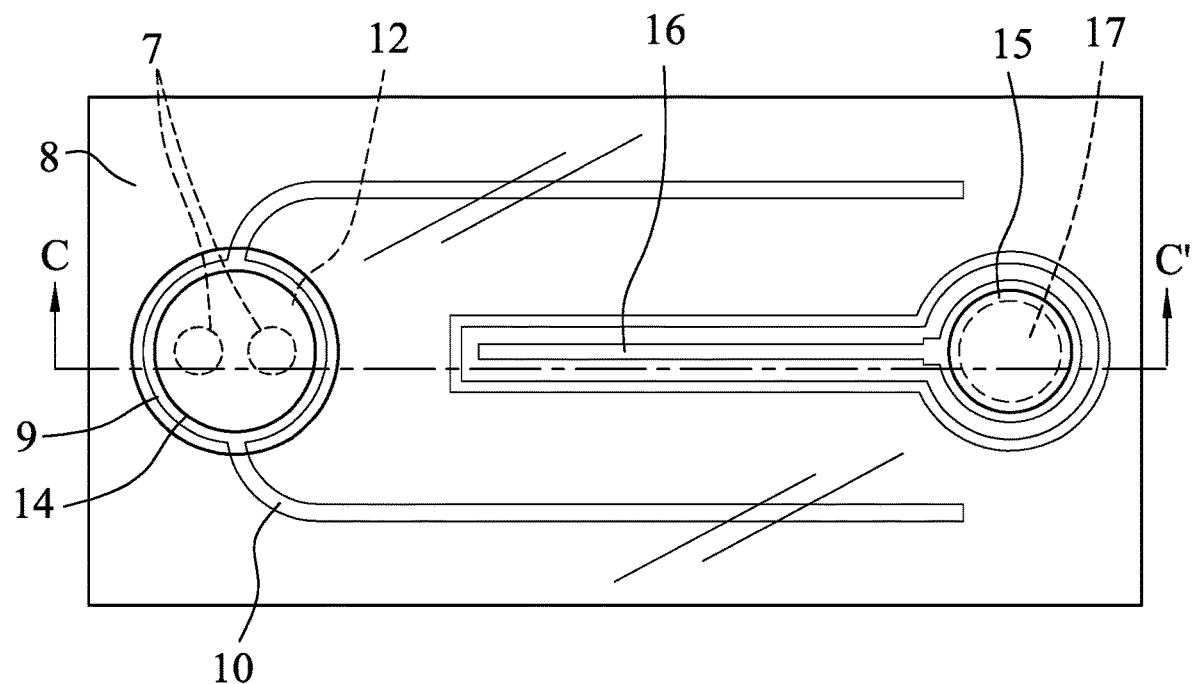
FIG. 7 is a schematic top view illustrating a second embodiment of the light-emitting diode according to the disclosure.
Figure 8:
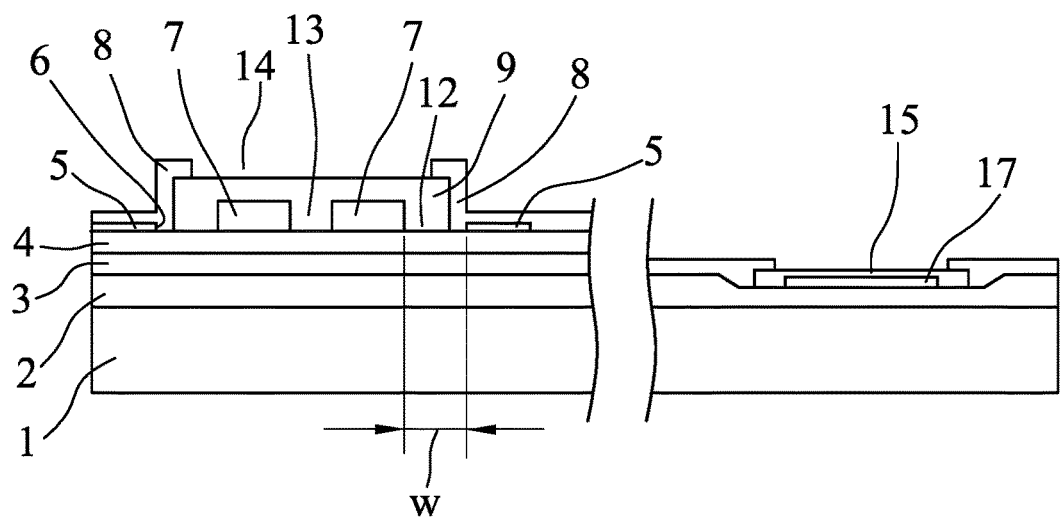
FIG. 8 is a cross-sectional view taken along a line C-C' of FIG. 7.
Figure 9:
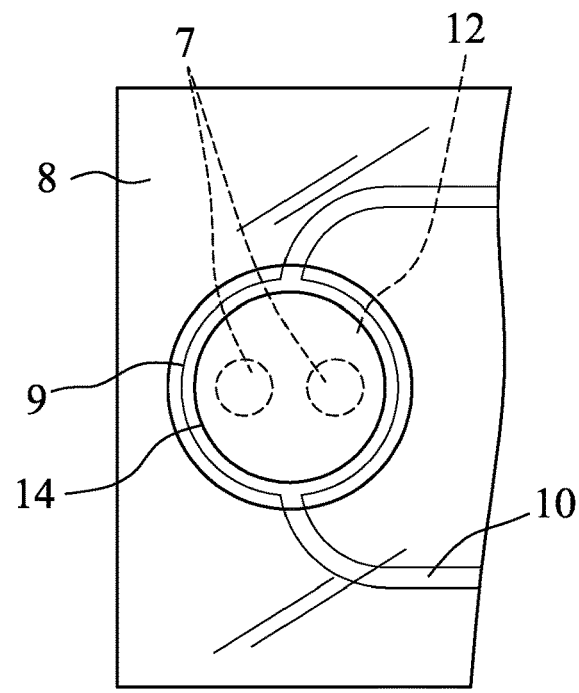
FIG. 9 is a fragmentary view of FIG. 7.

FIGS. 7 to 9 illustrate an LED according to a second embodiment of the disclosure. The second embodiment is similar to the first embodiment, except that in the second embodiment, the first current blocking layer 7 includes a plurality of the blocks that are spaced apart from each other and each of the blocks is in a circle shape. Two adjacent ones of the circle-shaped blocks define a second gap 13 therebetween. A portion of the first conductivity type semiconductor layer 4 is exposed through the second gap 13. The first electrode pad 9 is formed to be in contact with the first conductivity type semiconductor layer 4 through the first gap 12 and the second gap 13. In this embodiment, the first current blocking layer 7 includes two blocks. In the subsequent wiring process, the wiring force applied on the first current blocking layer 7 that includes the blocks may be reduced, thereby reducing the risk of the first current blocking layer 7 being damaged.

Figure 10:
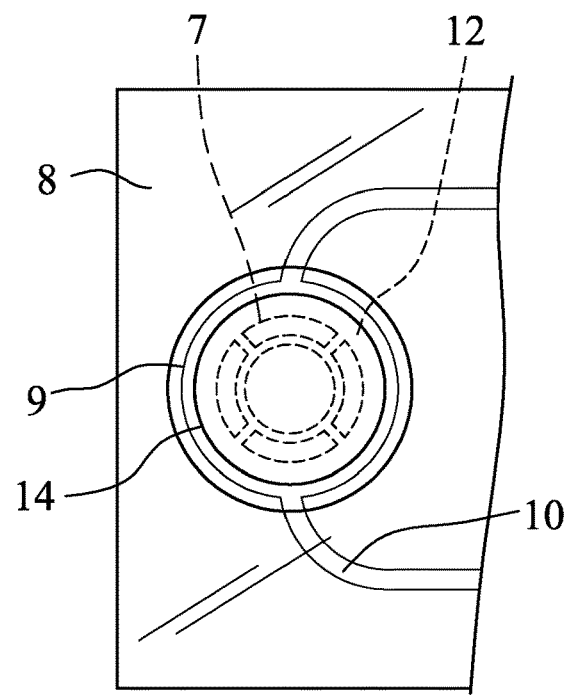
FIGS. 10 to 12 are views similar to FIG. 9, but illustrating variations of the second embodiment.
Figure 11:
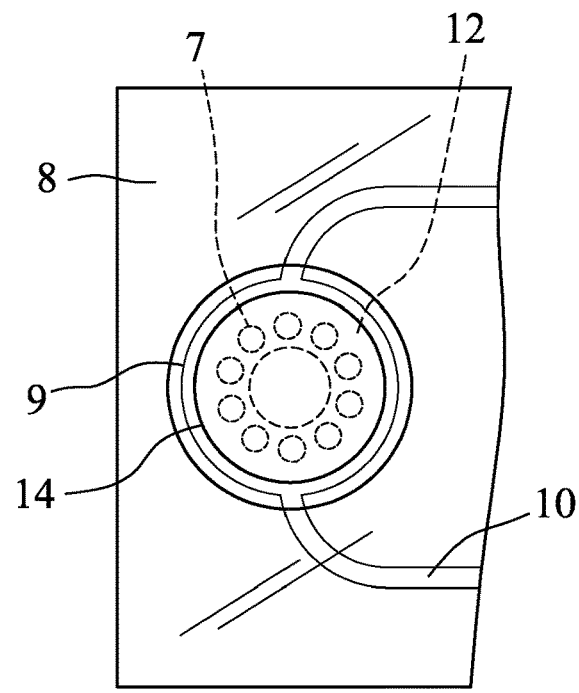
Figure 12:
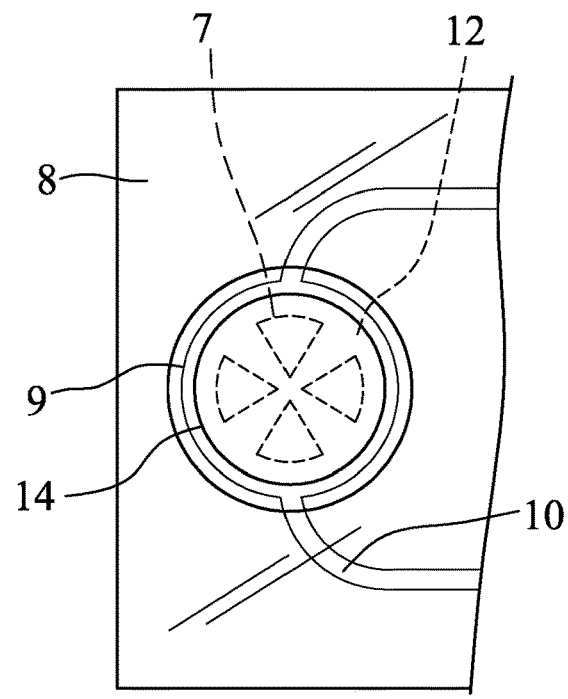

In an embodiment shown in FIG. 10, the first current blocking layer 7 includes four arc-shaped blocks, and a circle-shaped block that is centrally located and that is surrounded by the four arc-shaped blocks. In this embodiment, the circle-shaped block has a diameter greater than those of the four arc-shaped blocks. In an embodiment shown in FIG. 11, the first current blocking layer 7 includes a plurality of small circle-shaped blocks, and a large circle-shaped block that is centrally located and that is surrounded by the small circle-shaped blocks. In an embodiment shown in FIG. 12, the first current blocking layer 7 includes four fan-shaped blocks that are symmetrically distributed within the first opening 6.

Figure 13:
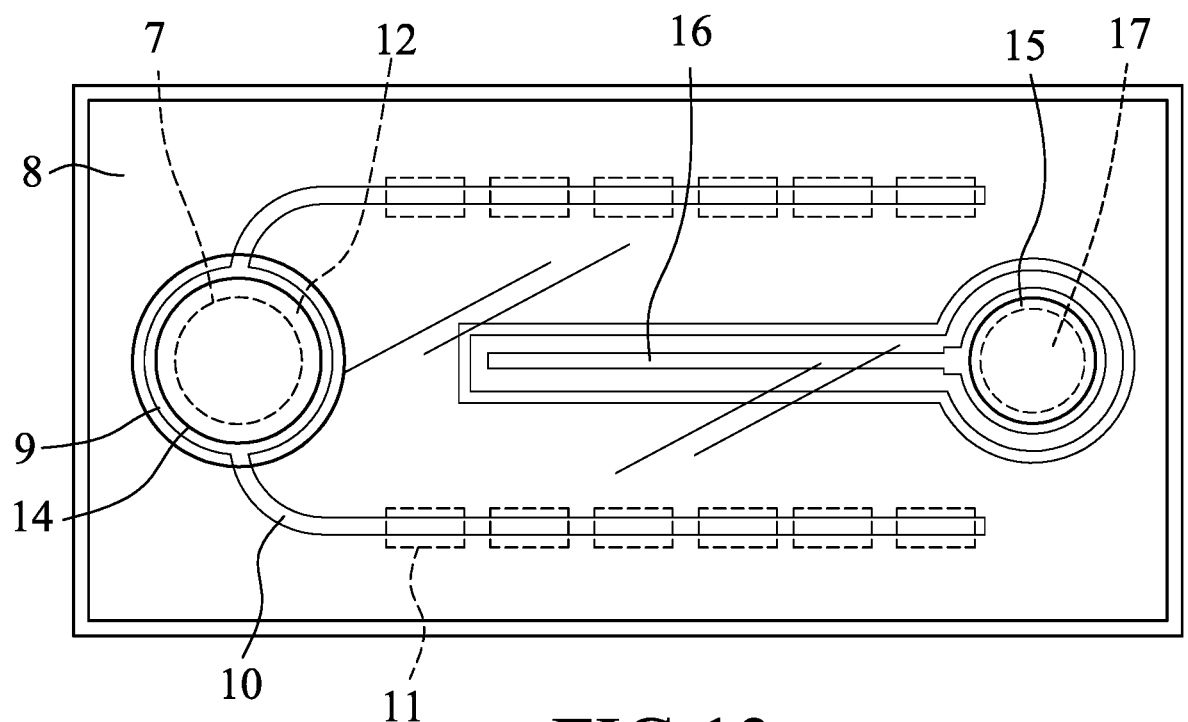
FIG. 13 is a schematic top view illustrating a third embodiment of the light-emitting diode according to the disclosure.
Figure 14:
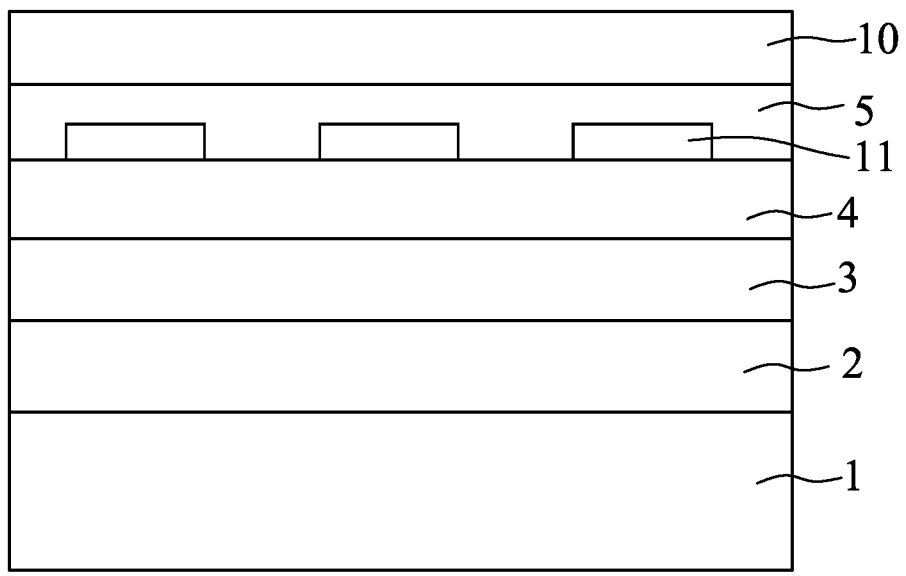
FIG. 14 is a fragmentary view of FIG. 13.

FIGS. 13 and 14 illustrate an LED according to a third embodiment of the disclosure. The third embodiment is similar to the first embodiment, except that in the third embodiment, the LED further includes at least one second current blocking layer 11 that is disposed on the semiconductor light-emitting stack and covered by the transparent conductive layer 5. Specifically, the at least one second current blocking layer 11 is disposed between the first conductivity type semiconductor layer 4 and the transparent conductive layer 5 located beneath the first electrode extension 10. The at least one second current blocking layer 11 is provided to block vertical current transmission and is conducive for lateral expansion of current. The second current blocking layer 11 is not in contact with the first current blocking layer 7. In certain embodiments, the LED includes a plurality of the second current blocking layers 11, and two adjacent ones of the second current blocking layers 11 are spaced apart from each other by a third gap. In such case, the transparent conductive layer 5 is in contact with the first conductivity type semiconductor layer 4 through the third gap.

The structure and material of the second current blocking layer 11 may be the same as those of the first current blocking layer 7 and the third current blocking layer 17, and detail descriptions thereof are omitted herein for the sake of brevity.

Figure 15:
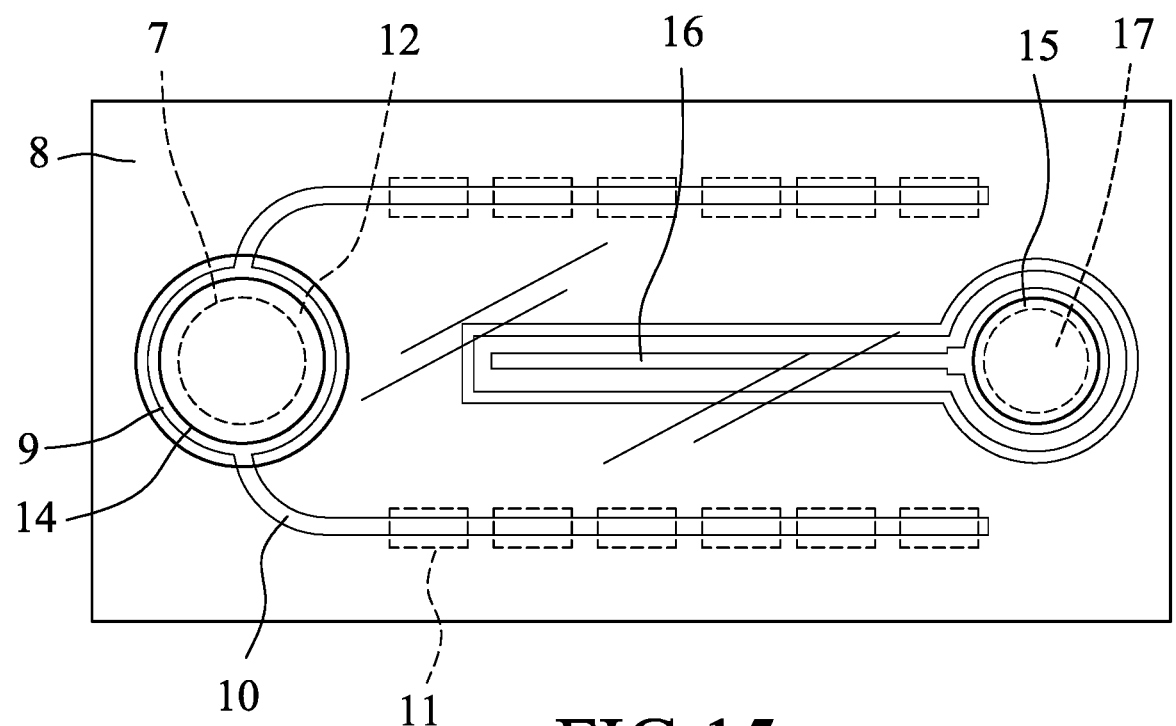
FIG. 15 is a schematic top view illustrating a fourth embodiment of the light-emitting diode according to the disclosure.
Figure 16:
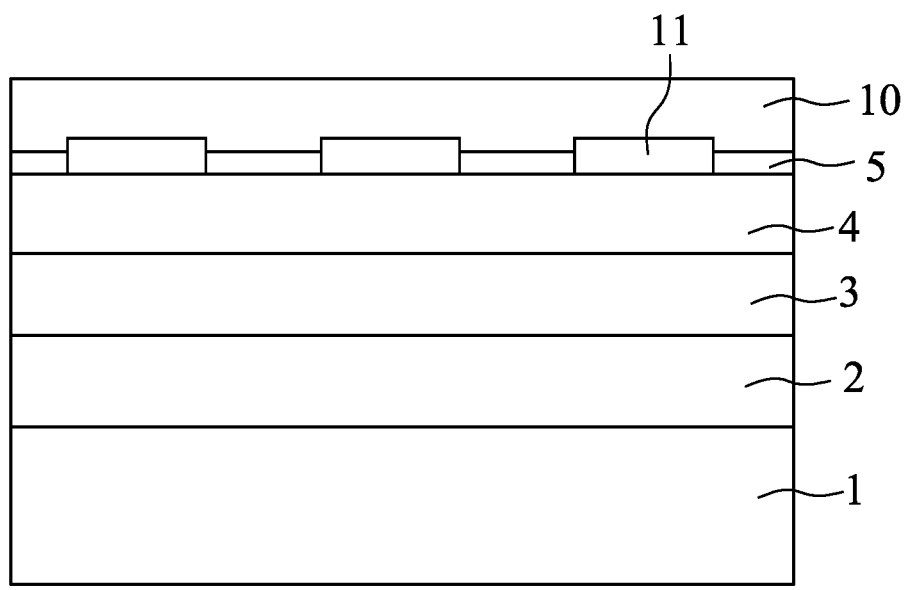
FIG. 16 is a fragmentary view of FIG. 15.

FIGS. 15 and 16 illustrate an LED according to a fourth embodiment of the disclosure. The fourth embodiment is similar to the third embodiment, except that in the fourth embodiment, the at least one second current blocking layer 11 is disposed beneath the first electrode extension 10. Specifically, the at least one second current blocking layer 11 is disposed between the first electrode extension 10 and the first conductivity type semiconductor layer 4. The at least one second current blocking layer 11 is in direct contact with the first electrode extension 10, which may be useful for increasing the brightness of the LED. In certain embodiments, the LED includes a plurality of the second current blocking layers 11, and two adjacent ones of the second current blocking layers 11 are spaced apart from each other by the third gap. In such case, the transparent conductive layer 5 is formed between the first electrode extension 10 and the first conductivity type semiconductor layer 4, and is filled in the third gaps among the second current blocking layers 11.

Figure 17:
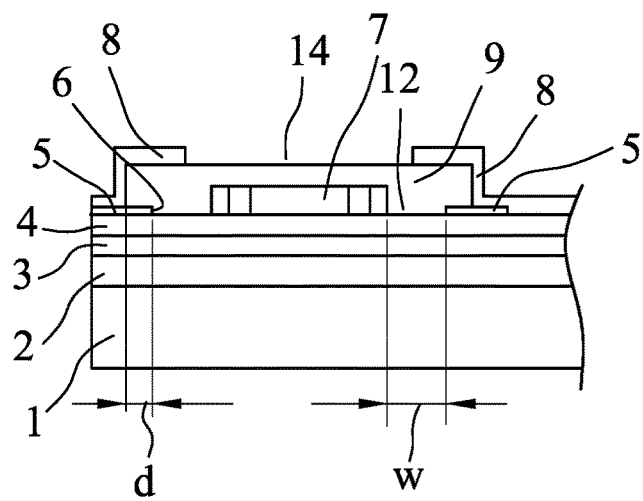
FIG. 17 is a cross-sectional view illustrating a fifth embodiment of the light-emitting diode according to the disclosure.
Figure 18:
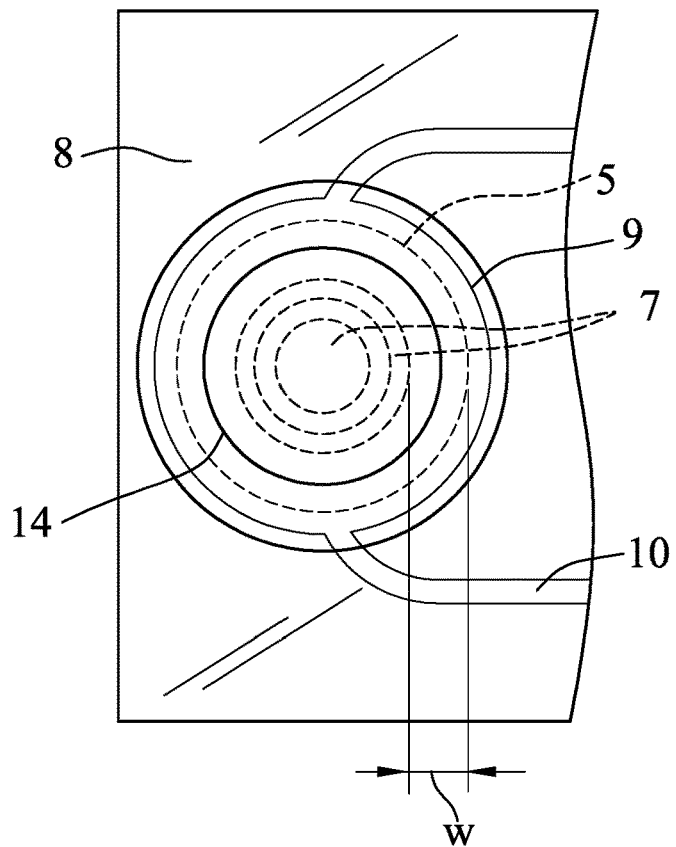
FIG. 18 is a fragmentary view of the fifth embodiment.

FIGS. 17 and 18 illustrate an LED according to a fifth embodiment of the disclosure. The fifth embodiment is similar to the first embodiment, except that in the fifth embodiment, the first electrode pad 9 has a diameter greater than that of the first opening 6, and the first current blocking layer 7 includes a circle-shaped block and a ring-shaped block surrounding the circle-shaped block. Specifically, the first electrode pad 9 is formed on the transparent conductive layer 5 to fully cover the first opening 6, and extends radially over the inner edge of the transparent conductive layer 5 by a distance (d) ranging from 3 μm to 19.9 μm.

In an embodiment, the LED may further include a fourth current blocking layer (not shown) disposed beneath the second electrode extension 16. Specifically, the fourth current blocking layer is disposed in the recess and between the second electrode extension 16 and the semiconductor light-emitting stack, and is extended from the first conductivity type semiconductor layer 4, along the inclined lateral surface of the light-emitting layer 3, to the second conductivity type semiconductor layer 2 for serving as an insulating layer.

The structure and material of the fourth current blocking layer may be the same as those of the first current blocking layer 7, the second current blocking layer 11, and the third current blocking layer 17, and detail descriptions thereof are omitted herein for the sake of brevity.

The material for making the substrate 1, the first conductivity type semiconductor layer 4, the light-emitting layer 3, the second conductivity type semiconductor layer 2, the transparent conductive layer 5, the first current blocking layer 7, the second current blocking layer 11, the third current blocking layer 17, the fourth current blocking layer, and the protective layer 8 can be adjusted according to actual requirements.

The LED may be further modified based on requirement. For example, the LED may further include a buffer layer (not shown) disposed between the substrate 1 and the second conductivity type semiconductor layer 2.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light-emitting diode comprising:
   a semiconductor light-emitting stack which includes, in sequence from bottom to top, a second conductivity type semiconductor layer, a light-emitting layer, and a first conductivity type semiconductor layer;
   a transparent conductive layer disposed on said first conductivity type semiconductor layer, and formed with a first opening which is defined by an inner edge of said transparent conductive layer;
   a first current blocking layer formed on said first conductivity type semiconductor layer, and surrounded by and spaced apart from said inner edge of said transparent conductive layer by a first gap which has a predetermined width; and
   a first electrode pad formed on said first current blocking layer to fully cover an upper surface and an outer peripheral surface of said first current blocking layer so as to permit said first electrode pad to be in contact with said first conductivity type semiconductor layer through said first gap.

2. The light-emitting diode according to claim 1, further comprising a protective layer which covers said transparent conductive layer, said semiconductor light-emitting stack, and at least a portion of said first electrode pad.

3. The light-emitting diode according to claim 1, wherein said first electrode pad has a diameter not greater than that of said first opening.

4. The light-emitting diode according to claim 3, wherein an outer peripheral surface of said first electrode pad and said inner edge of said transparent conductive layer are separated by a spacing ranging from 5 μm to 20 μm.

5. The light-emitting diode according to claim 3, wherein said first electrode pad has a radial thickness on an outer peripheral surface of said first current blocking layer, the radial thickness ranging from 0.1 μm to 20 μm.

6. The light-emitting diode according to claim 1, wherein said first current blocking layer includes at least one block.

7. The light-emitting diode according to claim 6, wherein said block is in one of a ring shape and a solid shape.

8. The light-emitting diode according to claim 7, wherein said solid shape is selected from the group consisting of an arc shape, a fan shape, a circle shape, and a polygonal shape.

9. The light-emitting diode according to claim 6, wherein said first current blocking layer includes a plurality of said blocks that are spaced apart from each other, each of said blocks being in one of an arc shape, a fan shape, a circle shape, and a polygonal shape.

10. The light-emitting diode according to claim 9, wherein two adjacent ones of said blocks define a second gap therebetween, said first electrode pad being formed to be in contact with said first conductivity type semiconductor layer through said second gap.

11. The light-emitting diode according to claim 6, wherein said first current blocking layer includes a circle-shaped block and a ring-shaped block surrounding said circle-shaped block.

12. The light-emitting diode according to claim 1, further comprising a first electrode extension which is connected to an edge of said first electrode pad.

13. The light-emitting diode according to claim 12, wherein said first electrode extension extends from said edge of said first electrode pad to be disposed on and in contact with said transparent conductive layer.

14. The light-emitting diode according to claim 13, further comprising at least one second current blocking layer disposed between said transparent conductive layer and said semiconductor light-emitting stack.

15. The light-emitting diode according to claim 14, which comprises a plurality of said second current blocking layers, two adjacent ones of said second current blocking layers being spaced apart from each other by a third gap.

16. The light-emitting diode according to claim 13, further comprising at least one second current blocking layer disposed between said first electrode extension and said semiconductor light-emitting stack.

17. The light-emitting diode according to claim 16, which comprises a plurality of said second current blocking layers, two adjacent ones of said second current blocking layers being spaced apart from each other by a third gap, said transparent conductive layer being formed between said first electrode extension and said semiconductor light-emitting stack and being filled in said third gaps among said current second current blocking layers.

18. The light-emitting diode according to claim 1, wherein said predetermined width of said first gap ranges from 0.1 µm to 40 µm.

19. The light-emitting diode according to claim 1, wherein said first electrode pad has a diameter greater than that of said first opening.

20. The light-emitting diode according to claim 19, wherein said first electrode pad is formed on said transparent conductive layer to fully cover said first opening, and extends radially over said inner edge of said transparent conductive layer by a distance ranging from 3 µm to 19.9 µm.

* * * * *